United States Patent
Colinge et al.

(10) Patent No.: US 11,239,347 B2
(45) Date of Patent: Feb. 1, 2022

(54) METHOD FOR MAKING A TRANSISTOR OF WHICH THE ACTIVE REGION INCLUDES A SEMIMETAL MATERIAL

(71) Applicant: COMMISSARIAT A L'ENERGIE ATOMIQUE ET AUX ENERGIES ALTERNATIVES, Paris (FR)

(72) Inventors: Jean-Pierre Colinge, Grenoble (FR); Yves Morand, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/854,968

(22) Filed: Apr. 22, 2020

(65) Prior Publication Data

US 2020/0343374 A1    Oct. 29, 2020

(30) Foreign Application Priority Data

Apr. 25, 2019 (FR) ...................................... 19 04391

(51) Int. Cl.
*H01L 21/02* (2006.01)
*H01L 21/762* (2006.01)
(Continued)

(52) U.S. Cl.
CPC .... *H01L 29/66969* (2013.01); *H01L 29/6634* (2013.01)

(58) Field of Classification Search
CPC ........... H01L 29/66969; H01L 29/6634; H01L 29/775; H01L 29/0673; H01L 29/0665;
(Continued)

(56) References Cited

U.S. PATENT DOCUMENTS 5,349,228 A * 9/1994 Neudeck ........... H01L 29/66772
257/347
8,921,188 B2 * 12/2014 Asra ............... H01L 21/823878
438/296

(Continued)

OTHER PUBLICATIONS

French Preliminary Search Report dated Jan. 21, 2020 in French Application 19 04391 filed Apr. 25, 2019 (with English Translation of Categories of Cited Documents), citing documents AA-AE and AX therein, 2 pages.

(Continued)

*Primary Examiner* — Natalia A Gondarenko
(74) *Attorney, Agent, or Firm* — Oblon, McClelland, Maier & Neustadt, L.L.P.

(57) ABSTRACT

Method for making a transistor, comprising:
making, on a substrate, a gate surrounded by a dielectric material;
depositing a stop layer on the gate and the dielectric material;
etching the stop layer in accordance with an active region pattern, forming a channel location located on the gate;
etching the dielectric material located in the active region pattern, forming source and drain locations;
depositing a semimetal material in the channel, source and drain locations;
planarizing the semimetal material;
crystallizing the semimetal material, forming the channel and the source and drain;
and wherein the semimetal material of the channel is semiconductive and the semimetal material of the source and drain is electrically conductive.

13 Claims, 9 Drawing Sheets

(51) Int. Cl.
*H01L 29/06* (2006.01)
*H01L 29/66* (2006.01)

(58) Field of Classification Search
CPC ............ H01L 29/0669; H01L 29/0684; H01L 21/02521; H01L 21/02603; H01L 21/0259; H01L 21/02595; H01L 21/02538; H01L 21/02609; H01L 21/02612; H01L 21/304; H01L 21/3043; H01L 21/30617; H01L 21/28; H01L 21/28008; H01L 21/823412; H01L 21/823807; H01L 21/7838; H01L 29/0847; H01L 29/24; H01L 29/42356; H01L 29/4236; H01L 29/42364; H01L 29/4238; H01L 29/42384; H01L 29/43; H01L 29/4908; H01L 29/4916; H01L 29/66075; H01L 29/66439; H01L 2224/05113; H01L 2224/05213; B82Y 10/00; B82Y 40/00; B82Y 30/00; B82Y 35/00
USPC ... 438/151, 291, 586, 617, 99, 29, 497, 790, 438/781, 782, 502, 768; 257/72, 330
See application file for complete search history.

(56) References Cited

U.S. PATENT DOCUMENTS

| | | | |
|---|---|---|---|
| 8,936,977 B2 * | 1/2015 | Hoentschel | H01L 29/1054 438/184 |
| 2010/0258787 A1 | 10/2010 | Chae et al. | |
| 2013/0092927 A1 | 4/2013 | Murai et al. | |
| 2014/0299838 A1 | 10/2014 | Lee et al. | |
| 2016/0268382 A1 * | 9/2016 | Colinge | H01L 29/0649 |
| 2017/0358658 A1 | 12/2017 | Rios et al. | |
| 2018/0190799 A1 | 7/2018 | Colinge et al. | |
| 2018/0261669 A1 * | 9/2018 | Le | H01L 29/155 |

OTHER PUBLICATIONS

Kim, J. et al., "Semimetal to semiconductor transition and polymer electrolyte gate modulation in single-crystalline bismuth nanowires," Nanoscale, Jan. 1, 2017, pp. 923-929.

Bui, T. N. et al., "Semiconductor—to metallic-like behavior in Bi thin films on KCl substrate," Journal of Applied Physics, vol. 119, 135304, 2016, 8 pages.

* cited by examiner

METHOD FOR MAKING A TRANSISTOR OF WHICH THE ACTIVE REGION INCLUDES A SEMIMETAL MATERIAL

TECHNICAL FIELD AND PRIOR ART

The invention relates to a method for making a transistor of which the active region includes a semimetal material, and advantageously a semimetal material including bismuth.

A portion of semimetal material, also called semimetal, such as for example bismuth, has electrical conducting properties that differ according to the geometry and the dimensions of this portion. In the solid state, i.e. when the portion of semimetal material has substantial dimensions, the semimetal material is electrically conductive and has an electrical behaviour that is similar to that of a metal. When the dimensions of this portion of semimetal material are sufficiently small, such as for example when this portion corresponds to a nanowire, the semimetal material is semiconductive and has an electrical behaviour that is similar to that of a semiconductor material.

A first method for making a transistor of which the channel includes one or more bismuth nanowires has been proposed. A growth of bismuth nanowires is first of all carried out on a metal substrate. The nanowires obtained are then cut and detached from the metal substrate, then manipulated individually and used to form transistor channels, such as for example for the transistor described in document "Semimetal to semiconductor transition and polymer electrolyte gate modulation in single-crystalline bismuth nanowires" by J. Kim and al., Nanoscale, 2017, vol. 9, pp. 923-929. This first method is however not suited to be implemented industrially and manufacture, with substantial efficiency, transistors.

Document US 2018/0190799 A1 describes a second method for making a transistor of which the channel and one of the source and drain regions includes bismuth. In this second method, a first electrically conductive region intended to form a first of the source and drain regions of the transistor is first of all carried out by deposition on a substrate. A gate surrounded by a dielectric insulating material is then carried out on the first electrically conductive region. A hole is then made through the gate and a portion of the dielectric insulating material that covers the gate. This hole forms an access to the first electrically conductive region. The dimensions of this hole are such that when bismuth is then deposited in the hole (having formed therein beforehand a gate dielectric against the side walls of the hole), the bismuth nanowire obtained has an electrical behaviour that corresponds to that of a semiconductor material. The bismuth nanowire made forms the channel of the transistor. A portion of bismuth located above the channel, of which the dimensions are more substantial than those of the channel and which rests in part on the dielectric insulating material, is retained in order to form a second electrically conductive region corresponding to a second of the source and drain regions of the transistor.

Contrary to the first method described hereinabove, this second method is suitable for being implemented industrially on a large scale. However, this second method has the disadvantage that the transistor made necessarily has a vertical arrangement with regards to the substrate on which it is made, i.e. includes the channel thereof and the source and drain regions thereof which are aligned along an axis perpendicular to the surface of the substrate whereon the transistor is made. However, such a vertical arrangement is sometimes not suited to the structure of the circuit wherein the transistors are intended to be integrated. In addition, this method also has the disadvantage of having to form a vertical contact line between the first electrically conductive region of the transistor (which corresponds for example to the source region of the transistor) and the upper portion of the structure, above the second electrically conductive region, where the metal interconnects are. This line consumes a substantial surface per transistor.

DISCLOSURE OF THE INVENTION

There is therefore a need to propose a method for making a semimetal material transistor that is suitable for being implemented industrially and manufacturing transistors with a substantial efficiency, making it possible to make a transistor that has a planar arrangement, i.e. not vertical, with regards to the substrate whereon the transistor is made, and which does not require any particular implementation in order to obtain good electrical contact between the channel and the source and drain regions.

For this, a method is proposed for making at least one transistor, comprising at least the implementation of the following steps:
   making, on a substrate, at least one gate surrounded laterally by at least one dielectric insulating material;
   depositing at least one etching stop layer on the gate and the dielectric insulating material;
   etching the etching stop layer in accordance with at least one pattern of an active region of the transistor, forming at least one portion of a channel location located on a portion of the gate;
   etching the dielectric insulating material located in the pattern of the active region, forming locations of source and drain regions;
   making at least one semimetal material in the channel location and in the locations of the source and drain regions;
   planarizing the semimetal material with stopping on the etching stop layer;
   crystallizing the semimetal material, forming the channel and the source and drain regions of the transistor;
   and wherein the channel includes dimensions such that the semimetal material of the channel has electrical characteristics, in particular electrical conductivity, of a semiconductor material, and the source and drain regions include dimensions such that the semimetal material of the source and drain regions has electrical characteristics, in particular electrical conductivity, of an electrically conductive material.

Such a method has the advantage of implementing steps that are compatible with the conventional techniques in microelectronics, and is therefore compatible with an industrial implementation on a large scale, and this due to the fact that the portion of semimetal material forming the channel is not made beforehand by growth on a metal substrate, but by the making, for example by deposition, of the semimetal material in the channel location and in the locations of the source and drain regions, followed by a planarizing step, thus shaping the semimetal material according to the final shape thereof defined by a "mould" located directly at the desired locations and formed by the channel and source and drain regions locations.

This method also has the advantage of making a transistor of the MOSFET type that has a planar, or horizontal, arrangement with regards to the substrate on which it is made, i.e. arranged such that the channel and the source and drain regions are aligned along an axis that is substantially parallel to the surface of the substrate on which the transistor is made.

Furthermore, this method does not require the implementation of any particular step in order to obtain good electrical contact between the channel and the source and drain regions.

This method proposes to make, prior to the depositing of the semimetal material, a "mould" formed by the channel and source and drain region locations and wherein the semimetal material is deposited. The depositing of the semimetal material in this mould prevents the semimetal material from having rough surfaces and from defining the shape that the semimetal material will take after the crystallizing thereof.

The portion of semimetal material, or each one of the portions of semimetal material, forming the channel may advantageously be provided with a cross section (which corresponds to the section perpendicular to the largest dimension, or length, of the or of each one of these portions) of a critical dimension or diameter less than a threshold below which the semimetal material has electrical conductivity properties similar to those of a semiconductor material, with valence and conduction bands separated by a band gap, of which the gap is positive. This semiconductor behaviour is obtained by quantum confinement effects of the charge carriers (electrons). When the semimetal material is for example bismuth, this threshold may be about 15 nm at ambient temperature. When the semimetal material is for example tin, this threshold may be about 2 nm at ambient temperature.

The portion of semimetal material that forms the channel may have a shape such that its length/diameter ratio (or critical length/dimension of its cross section) is greater than or equal to 2.

The semimetal material is an anisotropic effective mass material, which makes it possible to have both great mobility for the electrons and a strong density of states in the conduction band. These two factors contribute to increasing the current that can pass in the transistor and, consequently, increase the switching speed of this transistor in relation to a conventional transistor including the semiconductor.

Each one of the portions of semimetal material that form the source and drain regions may advantageously be provided with a cross section with a critical dimension or diameter greater than this threshold. The dimensions of the portions of semimetal material that form the source and drain regions are sufficiently substantial so that a quantum confinement cannot occur in these portions.

The "dielectric insulating material located in the pattern of the active region" may correspond to the portions of the dielectric insulating material that are not covered by an etching mask of which the pattern corresponds to that of the active region, i.e. an etching mask comprising at least one opening of which the edges delimit the shape of the active region of the transistor, and which corresponds for example to an etching mask used during the etching of the etching stop layer.

The semimetal material may be polycrystalline when it is made. The crystallizing which is then implemented makes it possible in this case to give it a monocrystalline nature.

It is also possible that the semimetal material be amorphous when it is made. The crystallizing that is then implemented makes it possible in this case to give it a monocrystalline or polycrystalline nature.

Advantageously, the semimetal material is not doped, which makes it possible to prevent an uncontrolled distribution of dopants in the semimetal material during the crystallizing. However, it is possible that the semimetal material be doped, for example with atoms of at least one of the following elements: boron, gallium, tin, tellurium.

The semimetal material may advantageously include bismuth. Then, this semimetal material may correspond to bismuth or an alloy comprising bismuth such as a semimetal material comprising bismuth and at least one of the following materials: tin, antimony, arsenic.

The method may further include, between the etching of the etching stop layer and the etching of the dielectric insulating material, the implementing of a step of etching, in the pattern of the active region, a portion of the thickness of the gate such that the channel location is located on at least one remaining portion of the gate. In such a configuration, the channel location is formed in the thickness of the etching stop layer and in the portion of the etched thickness of the gate. In addition, the gate may also be arranged facing a portion of the lateral flanks, or side walls, of the portion or portions of the semimetal material that form the channel of the transistor. The etching, in the pattern of the active region, of a portion of the thickness of the gate may correspond to an etching of a portion of the thickness of portion(s) of the gate accessible through an etching mask of which the pattern corresponds to that of the active region, and which corresponds for example to an etching mask used during the etching of the etching stop layer and/or during the etching of the dielectric insulating material.

The method may be such that:
the gate includes at least first and second electrically conductive materials superimposed such that the first electrically conductive material is arranged between the substrate and the second electrically conductive material;
the portion of the thickness of the etched gate corresponds to at least one portion of the second electrically conductive material located in the pattern of the active region.

Using two separate electrically conductive materials can facilitate the etching of the portion of the thickness of the gate by defining because this portion of the thickness of the gate may correspond to the thickness of the second electrically conductive material.

Advantageously, the channel may include several nanowires of the semimetal material extending between the source and drain regions and each comprising dimensions such that the semimetal material of each nanowire has electrical characteristics of a semiconductor material.

Alternatively, the channel may include a single nanowire of the semimetal material.

Advantageously, the gate dielectric may include at least one dielectric material of which the dielectric constant (or relative permittivity) is greater than 3.9.

BRIEF DESCRIPTION OF THE DRAWINGS

The present invention shall be better understood when reading the description of embodiments given solely for the purposes of information and in no way limiting in reference to the accompanying drawings wherein.

Figure 1:
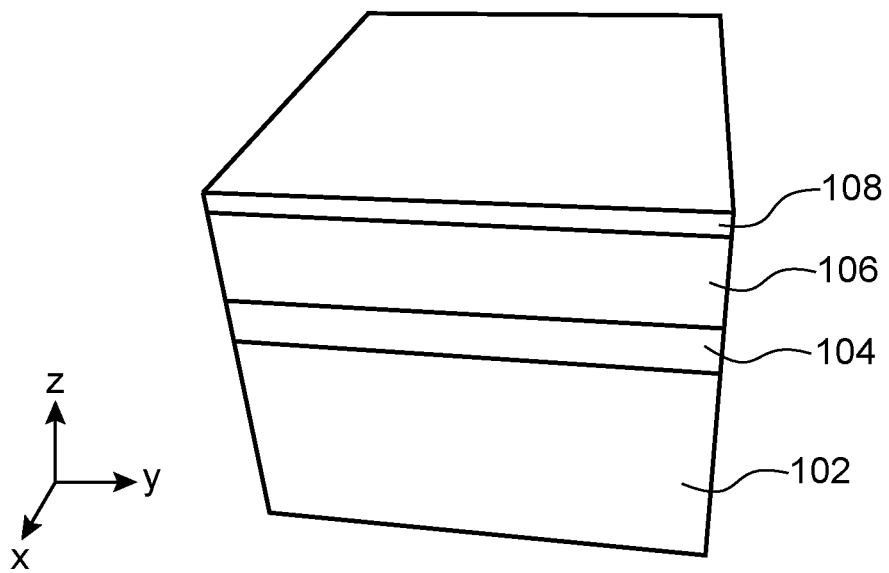
FIGS. 1 to 17 show the steps of a method for making a transistor according to a particular embodiment.

Identical, similar or equivalent parts of the various figures described hereinafter bear the same numerical references so as to facilitate passing from one figure to another.

The various parts shown in the figures are not necessarily shown on a uniform scale, in order to render the figures more legible.

The various possibilities (alternatives and embodiments) must be understood as not being exclusive from one another and can be combined together.

DETAILED DESCRIPTION OF PARTICULAR EMBODIMENTS

The description hereinbelow refers to FIGS. 1 to 17 which show the steps of a method for making a transistor 100 of which the active region includes a semimetal material, according to a particular embodiment.

The transistor 100 is made from a substrate formed, in this particular embodiment, by a support layer 102 comprising for example a dielectric substrate or a material that is commonly used in microelectronics, for example a semiconductor such as silicon, and by a buried dielectric layer 104 comprising for example $SiO_2$.

At least one electrically conductive layer, from which the gate of the transistor 100 will be formed afterwards, is then made on the substrate, and more particularly on the buried dielectric layer 104 in the particular embodiment described here. In the particular embodiment described here, a first electrically conductive layer 106 and a second electrically conductive layer 108 are deposited, for example by LPCVD, ALD, CVD, or PVD, successively on the buried dielectric layer 104 such that the first electrically conductive layer 106 is arranged between the buried dielectric layer 104 and the second electrically conductive layer 108.

In the particular embodiment described here, the material of the second electrically conductive layer 108 is intended to be selectively etched with regards to the material of the first electrically conductive layer 106. In this case, the material of the first electrically conductive layer 106 includes for example silicon doped and deposited in amorphous or polycrystalline form, and the material of the second electrically conductive layer 108 includes for example TiN deposited here by ALD.

The thickness (dimension parallel to the axis Z) of the first electrically conductive layer 106 is chosen such that it corresponds to the desired thickness of the source and drain regions of the transistor 100, and is for example between 30 nm and 100 nm. The thickness of the second electrically conductive layer 108 is for example between about 4 nm and 15 nm and is for example equal to 8 nm. The thickness of the second electrically conductive layer 108 is chosen such that it corresponds to the desired thickness on which the gate will cover the flanks, or sides, of the portion or portions of semimetal material that form the channel of the transistor 100.

Figure 2:
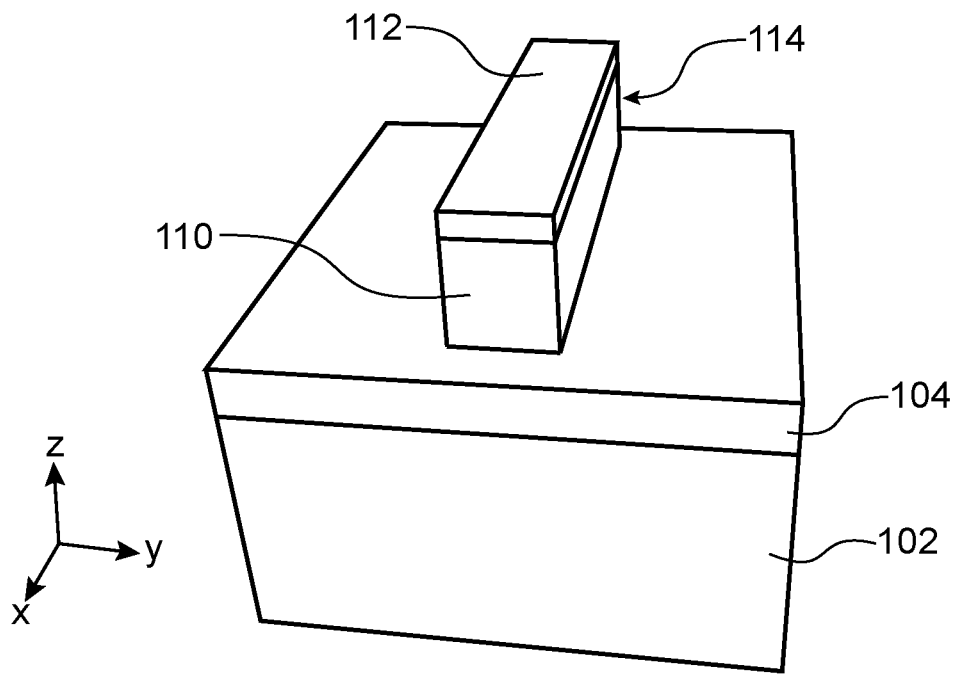

As shown in FIG. 2, the first and second electrically conductive layers 106, 108 are etched, for example by anisotropic plasma etching (the chemistry, or composition, of the plasma used depends in particular on the materials of the layers 108 and 106) according to the pattern or the shape of the gate desired. The remaining portions of the first and second electrically conductive layers 106, 108, respectively referenced as 110 and 112, form the gate 114 of the transistor 100. In the embodiment that can be seen in FIG. 2, the gate 114 has a rectangle parallelepiped shape, but other gate shapes are possible. The width and length (dimensions along the axes Y and X) of the gate 114 are chosen in particular according to the gate length, the channel width and the number of separate portions of material, or number of nanowires, intended to form the channel, desired within the transistor 100.

Figure 3:
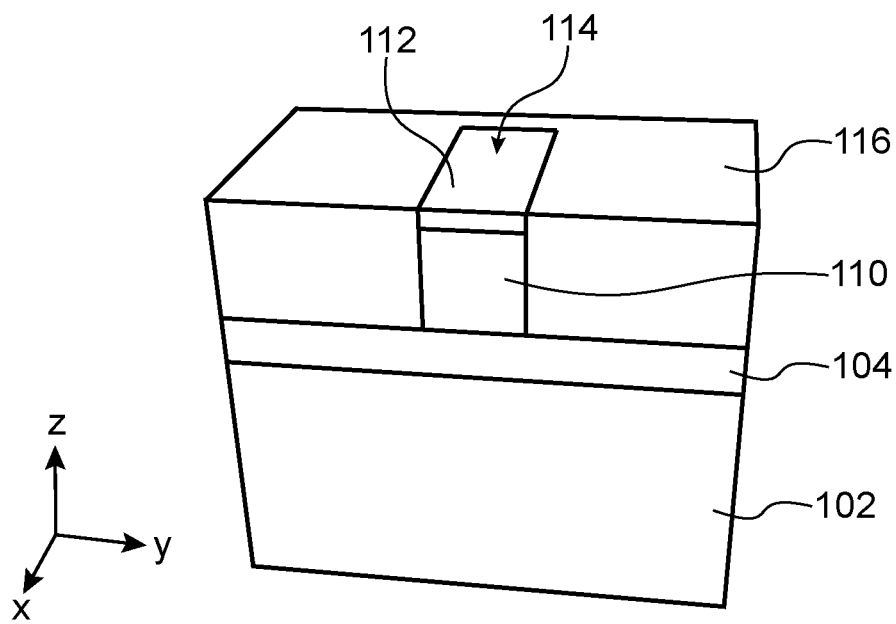

A dielectric insulating material 116, comprising for example $SiO_2$ or $Si_3N_4$, is then deposited for example by CVD, LPCVD or "spin-on" (spin coating) on the structure formed hereinabove, covering the portions of the buried dielectric layer 104 that are around the gate 114 and released during the previous etching of the first and second electrically conductive layers 106, 108, and also covering the gate 114. The thickness (dimension parallel to the axis Z) of the dielectric insulating material 116 deposited is here greater than the thickness of the gate 114. A chemical mechanical planarization, or CMP, of the dielectric insulating material 116 is then implemented with stopping on the gate 114. The remaining dielectric insulating material 116 is arranged on the buried dielectric layer 104 and laterally surrounds the gate 114. The remaining dielectric insulating material 116 has a thickness equal to that of the gate 114. FIG. 3 is a cross-section view, in a plane parallel to the plane (Y,Z) and which passes through the middle of the gate 114, showing the structure obtained at this stage of the method.

Figure 4:
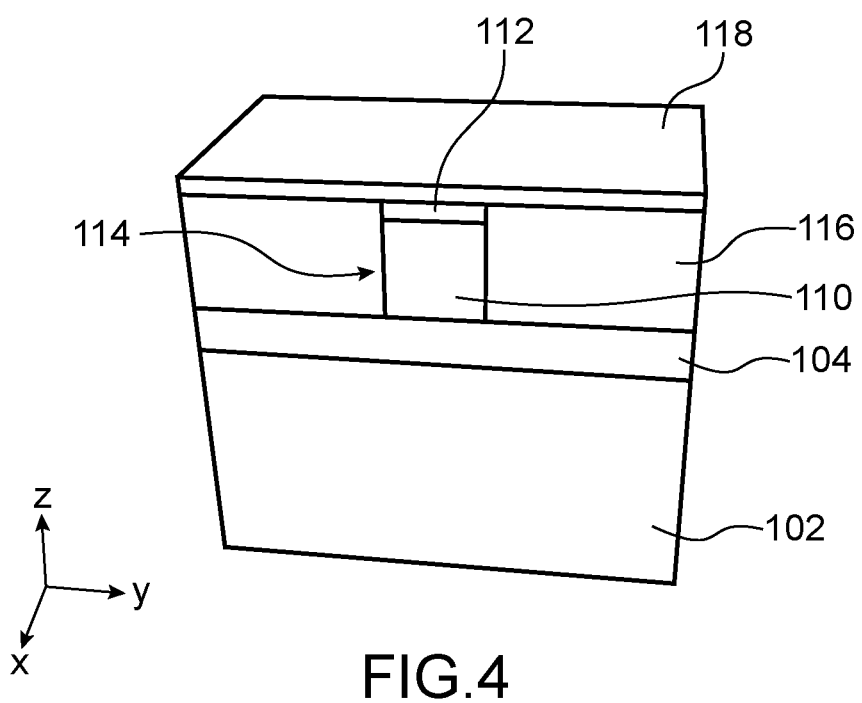

An etching stop layer 118 is then deposited, for example by LPCVD, CVD or plasma CVD, on the gate 114 and on the dielectric insulating material 116. This etching stop layer 118 includes a dielectric material, for example $Si_3N_4$. The thickness of the etching stop layer 118 is for example equal to about 20 nm. FIG. 4 is a cross-section view, in the same cut plane as that of the view of FIG. 3, showing the structure obtained at this stage of the method.

Figure 5:
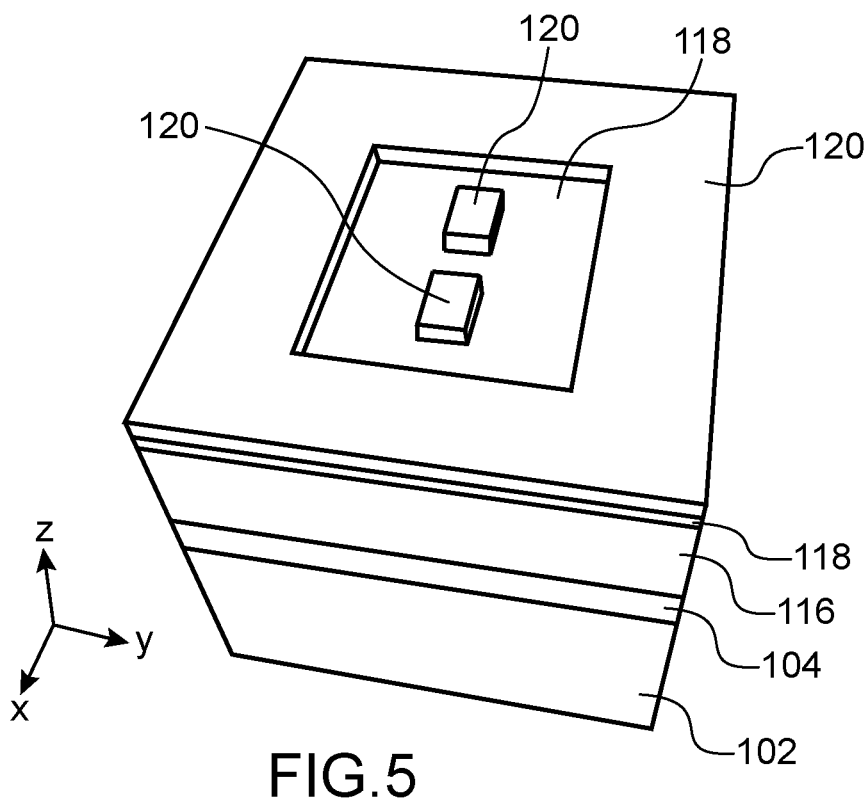

As shown in FIG. 5, an etching mask 120 comprising for example photosensitive resin, and of which the pattern corresponds to that of the active region of the transistor 100 (i.e. comprising at least one opening of which the edges delimit the shape of the active region) is made on the etching stop layer 118. The active region of the transistor 100 corresponds to the source and drain regions and to the channel of the transistor 100. In the embodiment described here, the channel of the transistor 100 is intended to be formed by three nanowires extending between the source and drain regions of the transistor 100.

Figure 6:
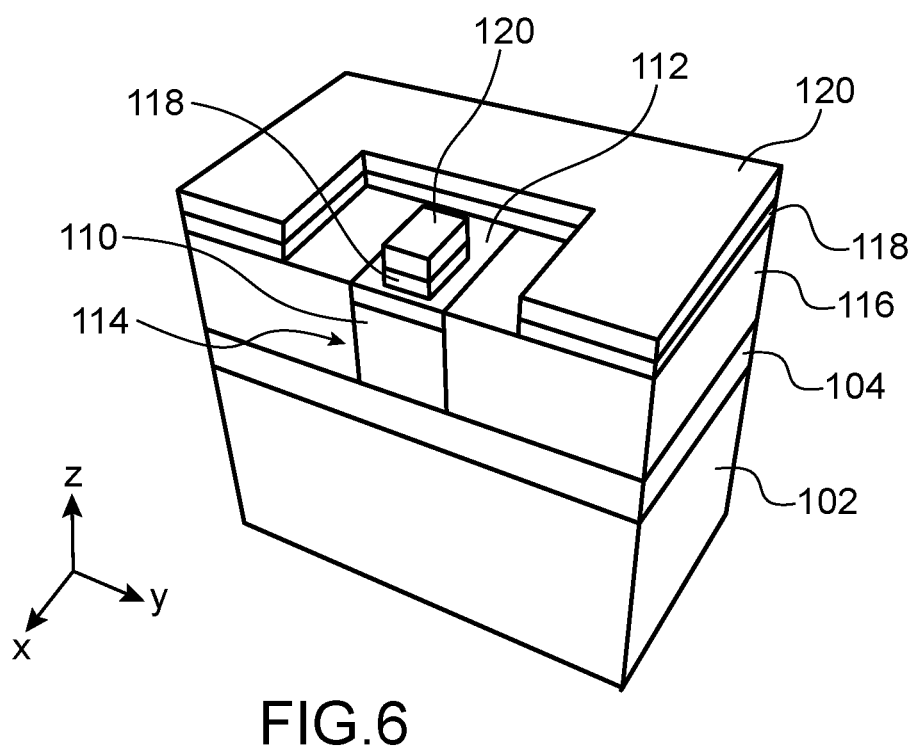

The etching stop layer 118 is then etched, for example by anisotropic plasma etching (the chemistry, or composition, of the plasma used depends in particular on the materials of the gate 114) according to the pattern defined by the etching mask 120, i.e. according to the pattern of the active region of the transistor 100. Then, the portions of the etching stop layer 118 that are not covered by the etching mask 120 (visible in FIG. 5) are etched. FIG. 6 is a cross-section view, in the same cut plane as that of the view of FIG. 4, showing the structure obtained at this stage of the method.

Figure 7:
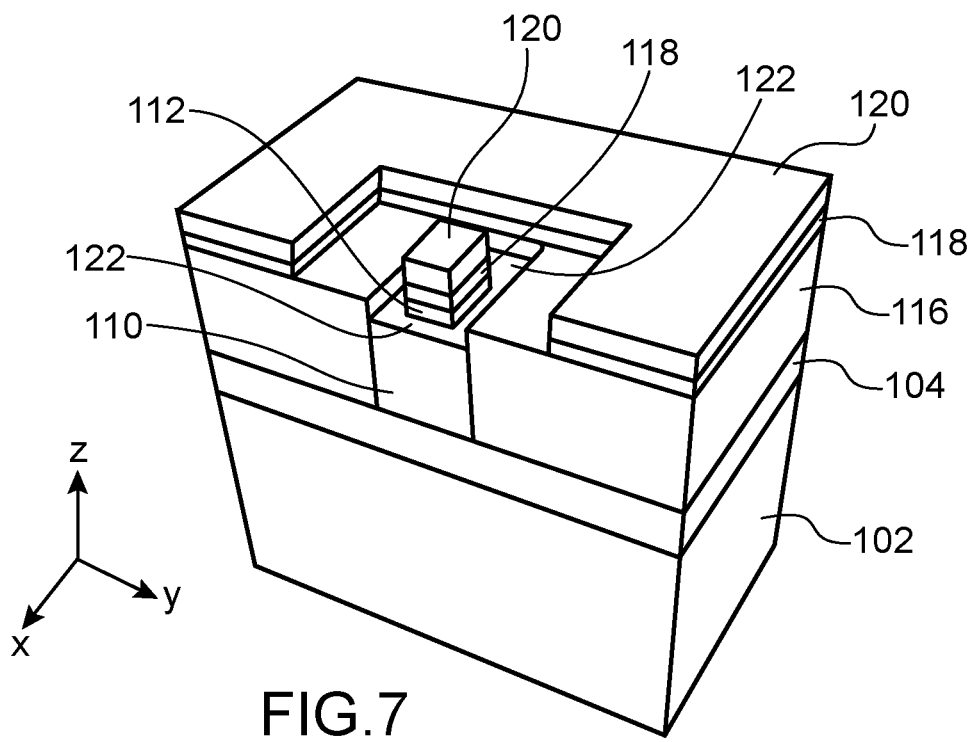

The parts of the portion 112 that are not covered by the etching mask 120 are then etched, for example by anisotropic plasma etching (the chemistry, or composition, of the plasma used depends in particular on the material of the portion 110), which forms the location or locations 122 of the channel of the transistor 100 above the portion 110 of the gate 114. In the embodiment described here, several channel locations 122 are formed by this etching step of the portion 112 because the channel of the transistor 100 is intended to be formed by several separate portions, for example several nanowires. FIG. 7 is a cross-section view, in the same cut plane as that of the view of FIG. 6, showing the structure obtained at this stage of the method. In FIG. 7, a first location 122 and a part of a second channel location 122 of the transistor 100 can be seen.

Figure 8:
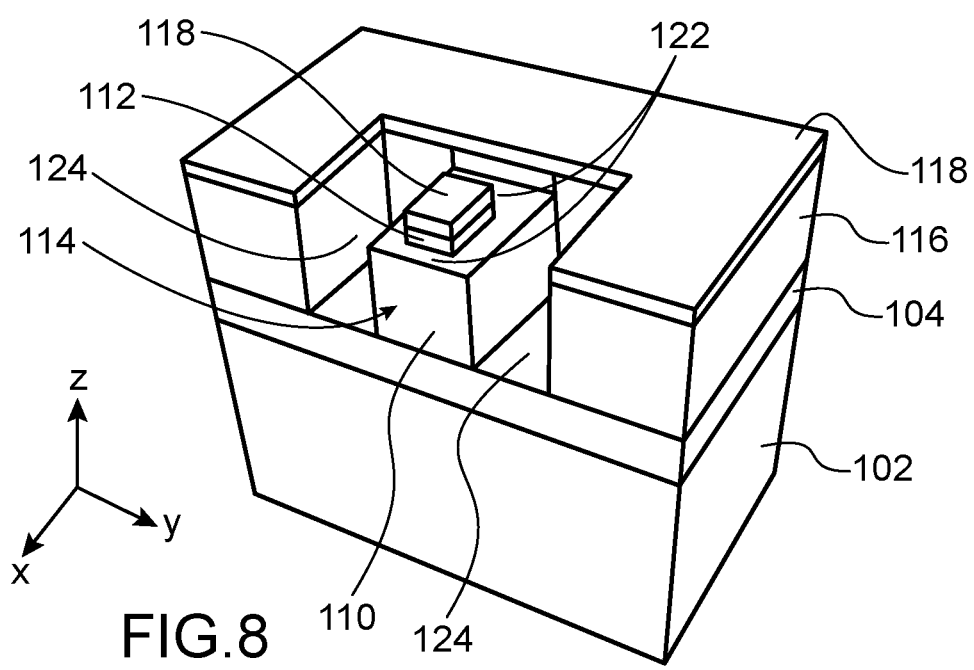
Figure 9:
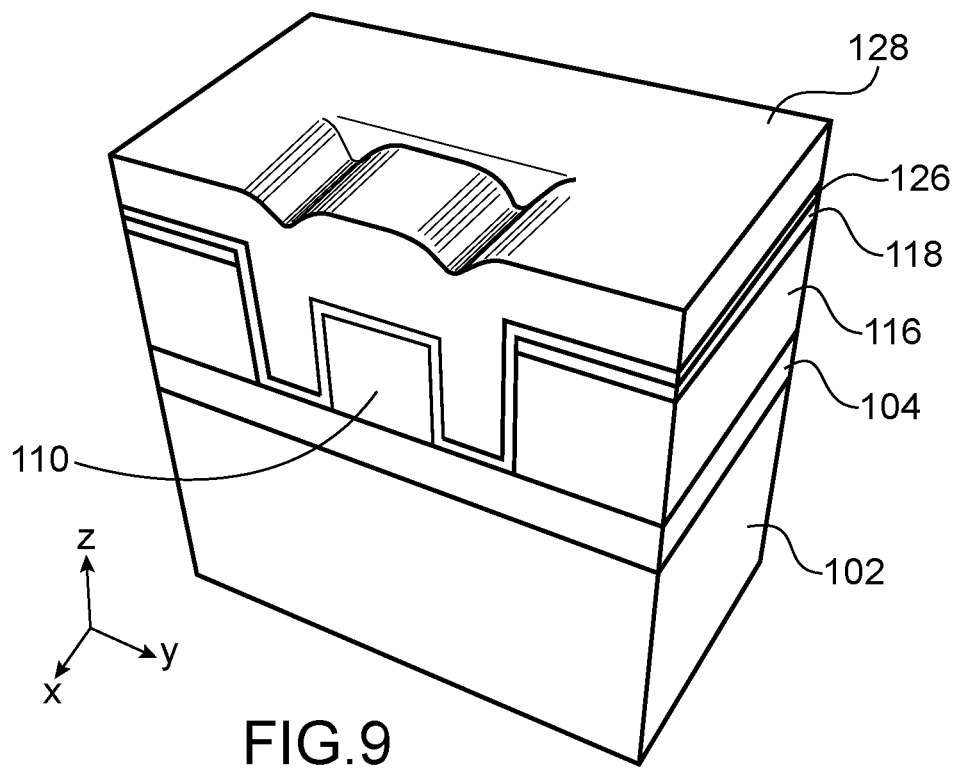

The portions of the dielectric insulating material 116 located in the pattern of the active region are etched, forming locations 124 for the source and drain regions of the transistor 100. The etching implemented corresponds to a selective etching of the dielectric insulating material 116 with regards to the material of the etching mask 120. After this etching of the dielectric insulating material 116, the etching mask 120 is suppressed, as can be seen in FIG. 8 which is a cross-section view, in the same cut plane as the one for the views of FIG. 7, showing the structure obtained at this stage of the method.

At this stage of the method, the locations 122, 124 form a mould wherein a semimetal material will be able to be deposited to form the active region of the transistor 100.

A gate dielectric 126 is then deposited conformally, with a substantially constant thickness, in the channel locations 122 and the locations 124 of the source and drain regions, as well as on the etching stop layer 118. This gate dielectric 126 covers in particular all the portions of the gate 110 made accessible by the preceding etching steps. This gate dielectric 126 advantageously includes at least one dielectric material with a high permittivity (or "high-k"), i.e. of which the dielectric permittivity is greater than 3.9, such as for example $HfO_2$ or $ZrO_2$. The gate dielectric 126 is for example deposited by ALD.

A semimetal material 128 is then formed, for example by deposition, on the gate dielectric 126, filling the channel locations 122 and the locations 124 of the source and drain regions. Semimetal material 128 is also formed on the portions of the gate dielectric 126 located on the etching stop layer 118. The semimetal material 128 advantageously includes bismuth, and is for example deposited as described in the document "Semiconductor- to metallic-like behaviour in Bi thin films on KCl substrate", Journal of Applied Physics, 119, 135304, 2016. The semimetal material 128 may be doped or not. The structure obtained at this stage of the method can be seen in FIG. 9 which is a cross-section view, in the same cut plane as that of the view of FIG. 8.

Figure 10:
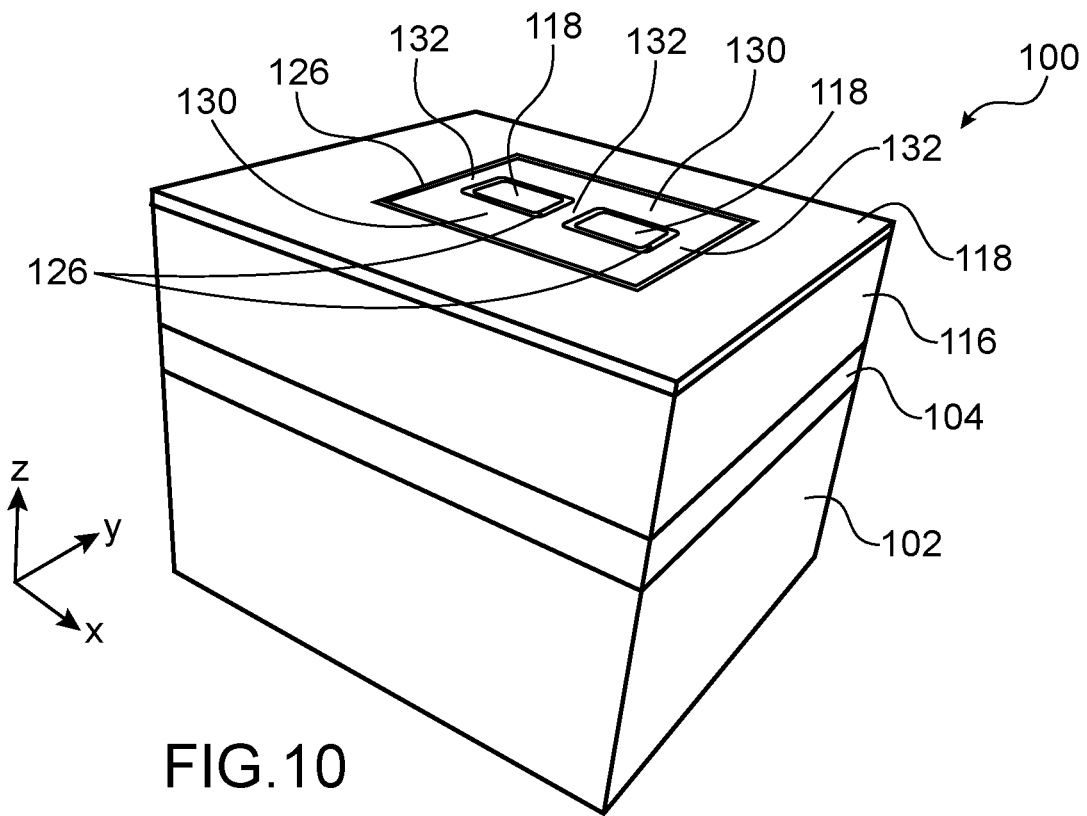
Figure 11:
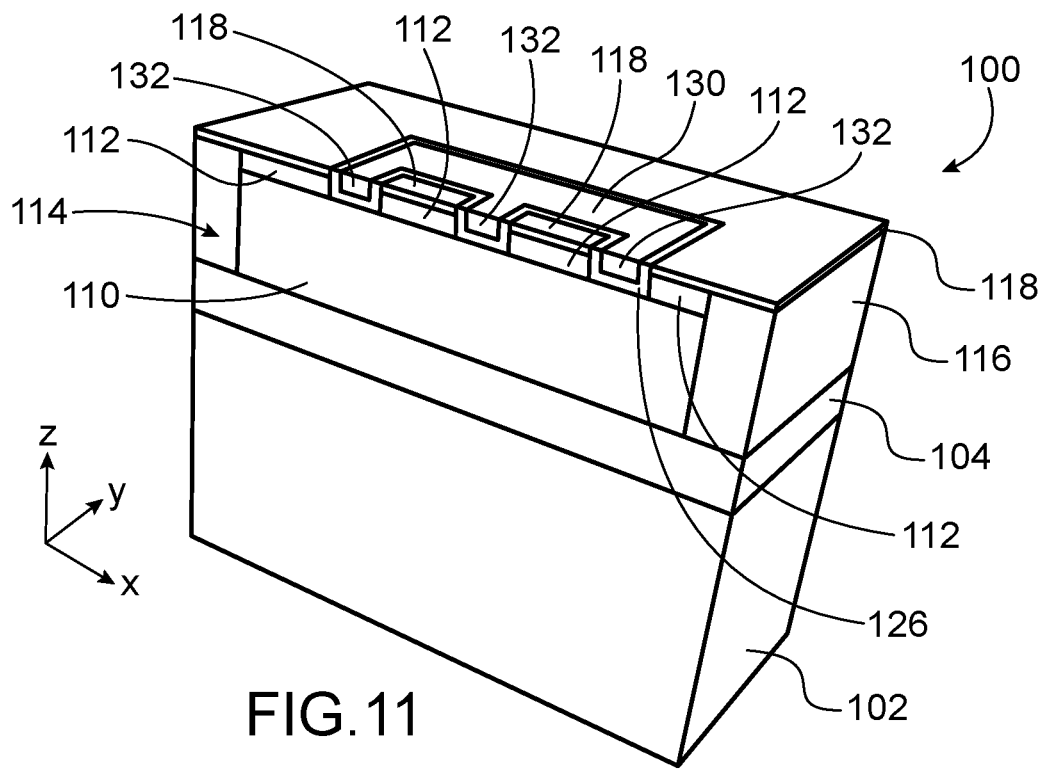
Figure 12:
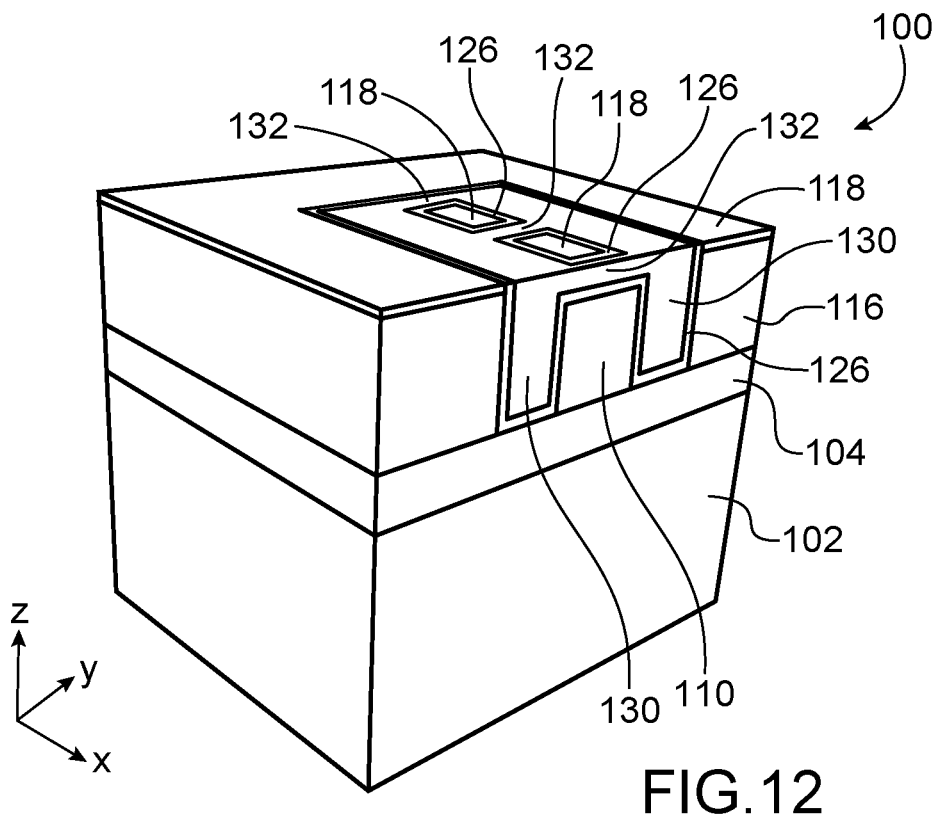
Figure 13:
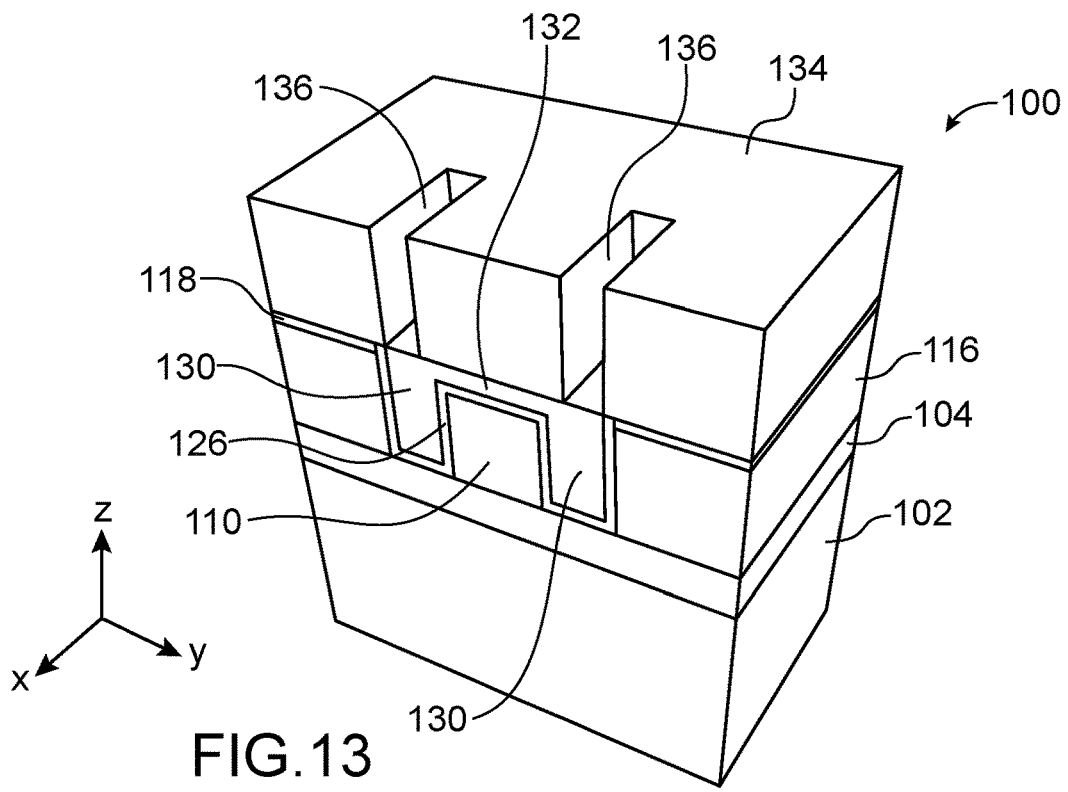

After this step, the surface of the semimetal material 128 is potentially irregular and rough. A chemical mechanical planarization of the semimetal material 128 with stopping on the etching stop layer 118 is then implemented, suppressing the roughness and the irregularities of the semimetal material 128 deposited. The structure obtained at this stage of the method is shown in FIG. 10. In this FIG. 10, the reference 130 designates the portions of the semimetal material 128 that form the source and drain regions of the transistor 100, and the reference 132 designates the portions of the semimetal material 128 that form the channel of the transistor 100. FIG. 11 is a cross-section view, in a plane parallel to the plane (X,Z) and which passes through the middle of the gate 114, showing the structure obtained at this stage of the method. FIG. 12 is a cross-section view, in a plane parallel to the plane (Y,Z) and which passes through one of the portions 132 forming the channel of the transistor 100, also showing the structure obtained at this stage of the method.

At this stage of the method, the semimetal material 128 is polycrystalline. Crystallization is implemented in order to render this semimetal material 128 crystalline, and advantageously monocrystalline. This crystallizing is implemented by depositing, for example by ALD, plasma CVD or CVD, and at low temperature in order to not melt the semimetal material 128, on the transistor 100, on the side where the etching stop layer 118 is located, a dielectric cover material 134. This dielectric cover material 134 covers at least the semimetal material 128, i.e. the portions 130 forming the source and drain regions and the portions 132 forming the channel of the transistor 100. In the particular embodiment described here, the dielectric cover material 134 also covers the etching stop layer 118. The dielectric cover material 134 includes for example $SiO_2$.

The dielectric cover material 134 thus deposited forms a cover that encloses the semimetal material of the portions 130, 132 deposited in the locations 122, 124.

An annealing is then implemented at a temperature greater than the melting temperature of the semimetal material of the portions 130, 132. When this semimetal material corresponds to bismuth, this annealing is implemented at a temperature greater than 271° C.

Bismuth is well suited to the implementation of such an annealing wherein the semimetal material is enclosed in the locations 122, 124 because bismuth has the property of not expanding when it melts.

The structure made is then cooled, which makes it possible to crystallize the semimetal material. The semimetal material, here bismuth, of the portions 132 that form the channel of the transistor 100 crystallizes into monocrystalline material.

Source and drain contact locations 136 are then etched, for example by anisotropic plasma etching (the chemistry, or composition, of the plasma used depends in particular on the dielectric cover material 134) through the dielectric cover material 134, facing the portions 130 that form the source and drain regions. These locations 136 open onto the crystallized semimetal material of the portions 130. These locations 136 can be seen in FIG. 13 which is a cross-section view, in the same cut plane as that of the view of FIG. 9, of the structure obtained at this stage of the method.

Figure 14:
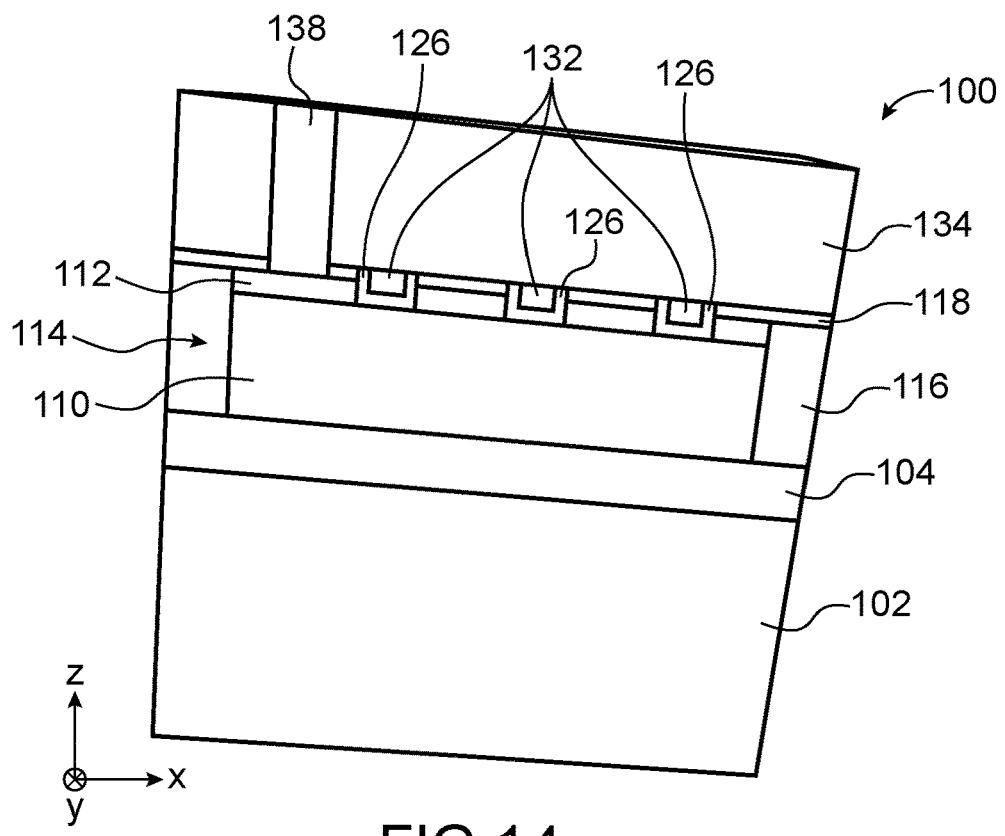
Figure 15:
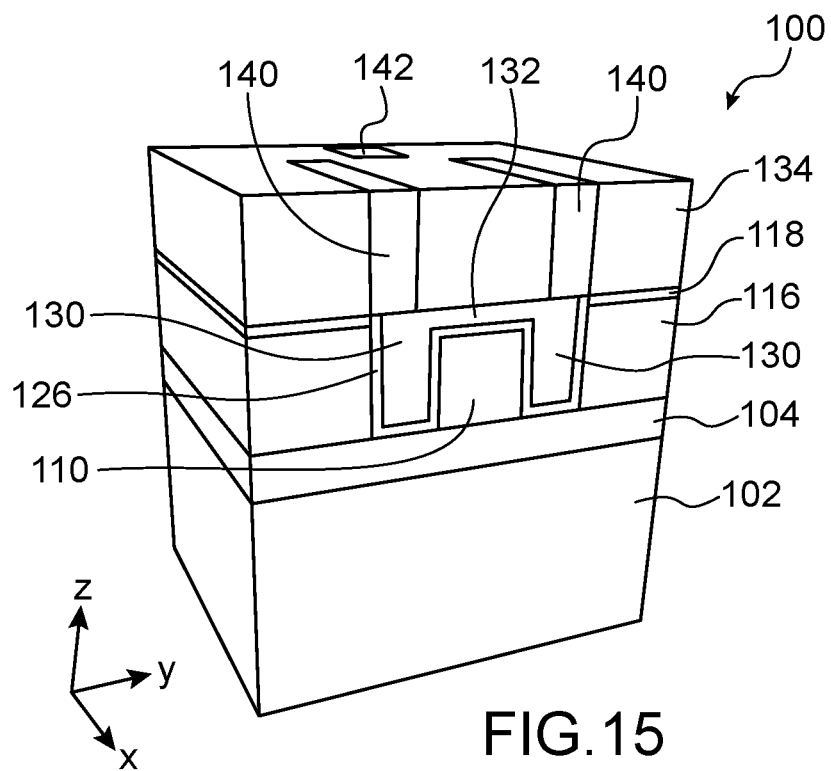
Figure 16:
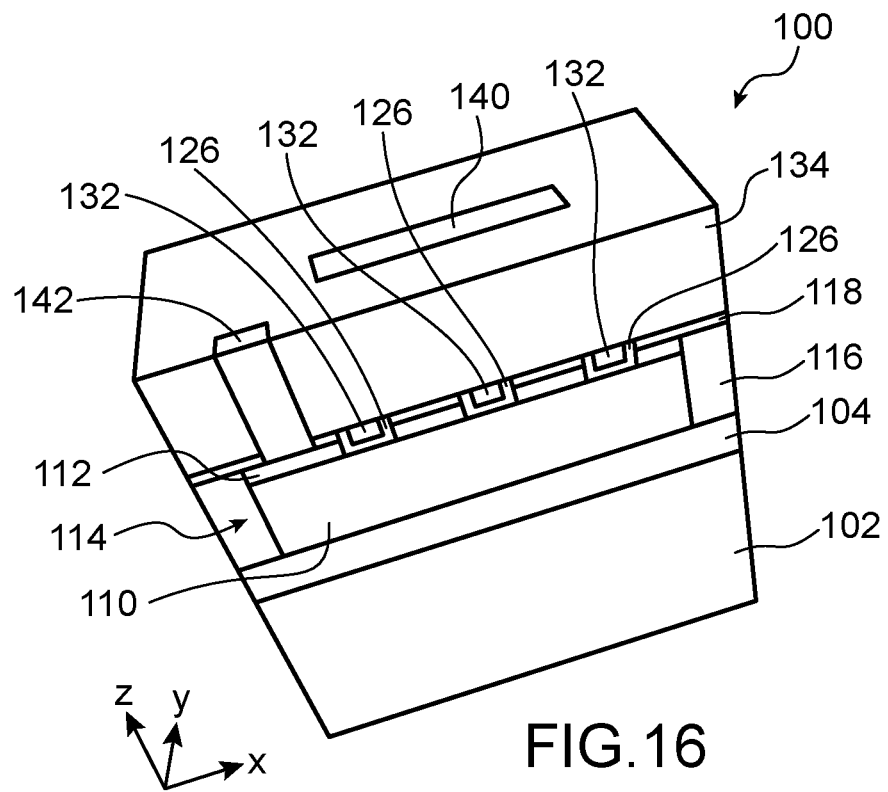

A gate contact location 138 is also etched through the dielectric cover material 134 and the etching stop layer 118, facing a portion of the gate 114 which is not located under the portions 132 that form the channel of the transistor 100. This location 138 opens onto a portion of the portion 112 of the gate 114, as can be seen in FIG. 14 which is a cross-section view, in the same cut plane as that of the view of FIG. 11, of the transistor 100.

An electrically conductive material, for example metal, is then deposited so as to fill the locations 136, 138. The portions of this electrically conductive material that are outside of the locations 136, 138, on the dielectric cover material 134, are suppressed, for example by etching or chemical mechanical planarization. The electrically conductive material that is in the locations 136 form electrical contacts 140 of the source and drain regions 130, and the electrically conductive material that is in the location 138 form an electrical contact 142 of the gate 114. These electrical contacts 140, 142 can be seen in FIG. 15 which is a cross-section view, in the same cut plane as that of the view of FIG. 13, of the transistor 100, and in FIG. 16 which is a cross-section view, in the same cut plane as that of the view of FIG. 14, of the transistor 100.

Figure 17:
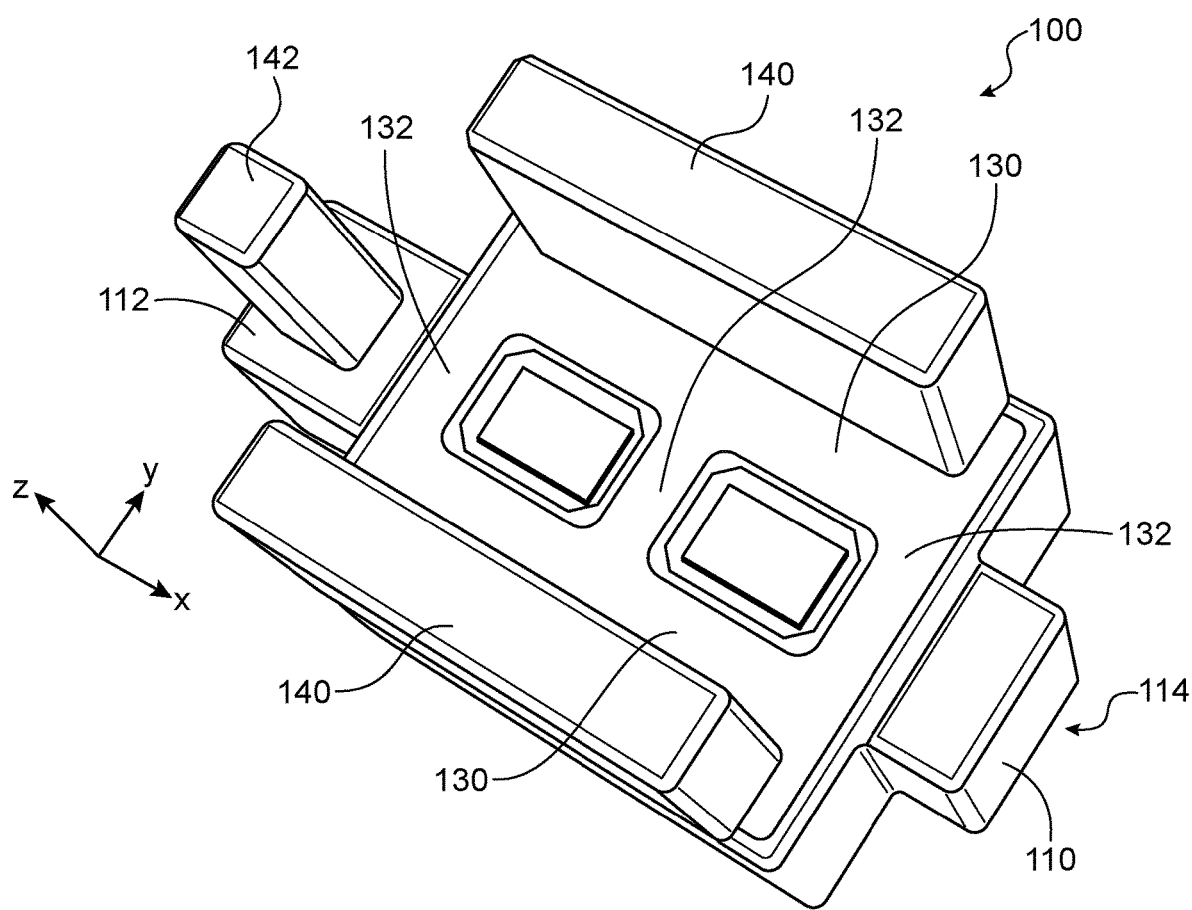

FIG. 17 shows a perspective view of the structure of the transistor 100 thus made, in which the substrate 102, the buried dielectric layer 104, the dielectric insulating material 116, the etching stop layer 118 and the dielectric cover material 134 are not shown.

In the particular embodiment described hereinabove, the gate 114 includes two separate electrically conductive materials, with the one of the portion 112 able to be selectively etched with respect to the one of the portion 110, which facilitates the making locations 122 of the channel of the transistor 100. Alternatively, it is possible that the gate 114 includes only one electrically conductive material. In this case, it is possible that the etching of the locations 122 is made in a portion of the thickness of this material.

The invention claimed is:

1. A method for making at least one transistor, comprising at least implementation of the following steps:
   making, on a substrate, at least one gate surrounded laterally by at least one dielectric insulating material;
   depositing at least one etching stop layer on said at least one gate and said at least one dielectric insulating material;
   etching said at least one etching stop layer in accordance with at least one pattern of an active region of the at least one transistor, forming at least one portion of a channel location located on a portion of said at least one gate;
   etching said at least one dielectric insulating material located in said at least one pattern of the active region, forming locations of source and drain regions and exposing a side surface of said at least one gate;
   making at least one semimetal material in the channel location and in the locations of the source and drain regions;
   planarizing said at least one semimetal material with stopping on said at least one etching stop layer; and
   crystallizing said at least one semimetal material, forming the channel and the source and drain regions of the at least one transistor;
   wherein the channel includes dimensions such that said at least one semimetal material of the channel has electrical characteristics of a semiconductor material, and the source and drain regions include dimensions such that said at least one semimetal material of the source and drain regions has electrical characteristics of an electrically conductive material.

2. The method according to claim 1, wherein said at least one semimetal material includes bismuth.

3. The method according to claim 1, wherein said at least one gate is made by implementing at least the following steps:
   depositing at least one electrically conductive layer on the substrate; and
   etching said at least one electrically conductive layer such that at least one remaining portion of said at least one electrically conductive layer forms said at least one gate.

4. The method according to claim 1, further including, between the etching of said at least one etching stop layer and the etching of said at least one dielectric insulating material, implementation of a step of etching, in said at least one pattern of the active region, a portion of a thickness of said at least one gate such that the channel location is located on at least one remaining portion of said at least one gate.

5. The method according to claim 4, wherein:
   said at least one gate includes at least first and second electrically conductive materials superimposed such that the first electrically conductive material is arranged between the substrate and the second electrically conductive material; and
   the portion of the thickness of said at least one etched gate corresponds to at least one portion of the second electrically conductive material located in said at least one pattern of the active region.

6. The method according to claim 1, wherein the channel includes several nanowires of said at least one semimetal material extending between the source and drain regions and each comprising dimensions such that said at least one semimetal material of each nanowire has electrical characteristics of a semiconductor material.

7. The method according to claim 1, wherein the crystallizing of said at least one semimetal material includes implementation of the following steps:
   depositing at least one dielectric cover material, covering at least said at least one semimetal material; and
   annealing at a temperature greater than a melting temperature of said at least one semimetal material.

8. The method The method according to claim 7, further including, after the annealing, implementation of the following steps:
   etching, through said at least one dielectric cover material and facing source and drain regions, source and drain contact locations;
   etching, through said at least one dielectric cover material and said at least one etching stop layer and facing a portion of said at least one gate, at least one gate contact location; and
   depositing at least one electrically conductive material in the source and drain contact locations and in the gate contact location.

9. The method according to claim 1, wherein:
   making said at least one semimetal material is preceded by depositing of a gate dielectric in the channel location and in the locations of the source and drain regions, said at least one semimetal material then being made on the gate dielectric; and
   the planarizing step further suppresses portions of the gate dielectric located on said at least one etching stop layer.

10. The method according to claim 9, wherein the gate dielectric includes at least one dielectric material of which a dielectric constant is greater than 3.9.

11. The method according to claim 1, wherein the substrate includes a semiconductor support layer and a dielectric layer such that the dielectric layer is arranged between said at least one gate and the semiconductor support layer and between said at least one dielectric insulating material and the semiconductor support layer.

12. The method according to claim 1, wherein:
   said at least one pattern of the active region is defined by an etching mask made on said at least one etching stop layer between the depositing of said at least one etching stop layer and the etching of said at least one etching stop layer; and
   the etching mask is removed between the etching of said at least one dielectric insulating material and the depositing of said at least one semimetal material.

13. A method for making at least one transistor, comprising:
   forming, on a substrate, at least one gate surrounded laterally by at least one dielectric insulating material;
   forming an etching mask with an opening corresponding to an active area of the at least one transistor and exposing the at least one gate and a portion of the at least one dielectric material;
   etching said at least one gate to form at least one portion of a channel location located on a portion of said at least one gate;
   etching said at least one dielectric insulating material exposing side wall portions of the gate to form locations of source and drain regions;
   forming a gate dielectric layer on the channel location, side wall portions, and the source and drain locations;
   forming at least one semimetal material on the gate dielectric material in the channel location and in the locations of the source and drain regions; and crystallizing said at least one semimetal material, forming the channel and the source and drain regions of the at least one transistor;

wherein the channel includes dimensions such that said at least one semimetal material of the channel has electrical characteristics of a semiconductor material, and the source and drain regions include dimensions such that said at least one semimetal material of the source and drain regions has electrical characteristics of an electrically conductive material.

\* \* \* \* \*